US008110487B2

(12) United States Patent
Griebenow et al.

(10) Patent No.: US 8,110,487 B2
(45) Date of Patent: Feb. 7, 2012

(54) METHOD OF CREATING A STRAINED CHANNEL REGION IN A TRANSISTOR BY DEEP IMPLANTATION OF STRAIN-INDUCING SPECIES BELOW THE CHANNEL REGION

(75) Inventors: Uwe Griebenow, Markkleeberg (DE); Kai Frohberg, Niederau (DE); Christoph Schwan, Dresden (DE); Kerstin Ruttloff, Hainichen (DE)

(73) Assignee: Advanced Micro Devices, Inc., Austin, TX (US)

( * ) Notice: Subject to any disclaimer, the term of this patent is extended or adjusted under 35 U.S.C. 154(b) by 200 days.

(21) Appl. No.: 12/178,206

(22) Filed: Jul. 23, 2008

(65) Prior Publication Data

US 2009/0194789 A1    Aug. 6, 2009

(30) Foreign Application Priority Data

Jan. 31, 2008 (DE) .................. 10 2008 006 961

(51) Int. Cl.
*H01L 21/425* (2006.01)

(52) U.S. Cl. . 438/517; 438/199; 257/213; 257/E21.337; 257/E29.193

(58) Field of Classification Search .............. 438/517; 257/288, E29.193
See application file for complete search history.

(56) References Cited

U.S. PATENT DOCUMENTS

| 6,297,082 | B1 * | 10/2001 | Lin et al. ................. 438/217 |
| 6,310,367 | B1 | 10/2001 | Yagishita et al. ......... 257/190 |
| 6,806,151 | B2 | 10/2004 | Wasshuber et al. ...... 438/301 |
| 7,871,877 | B2 * | 1/2011 | Griebenow et al. ...... 438/199 |
| 2004/0206950 | A1 | 10/2004 | Suvkhanov et al. ...... 257/19 |
| 2004/0256614 | A1 | 12/2004 | Ouyang et al. ........... 257/20 |
| 2004/0256650 | A1 * | 12/2004 | Ichige et al. ............. 257/296 |
| 2005/0029560 | A1 * | 2/2005 | Wasshuber et al. ...... 257/288 |
| 2005/0035409 | A1 | 2/2005 | Ko et al. ................. 257/350 |
| 2005/0045923 | A1 * | 3/2005 | Chambers ................ 257/288 |
| 2005/0059201 | A1 | 3/2005 | Chidambarrao et al. .. 438/216 |

(Continued)

FOREIGN PATENT DOCUMENTS

DE     102005051994 A1    5/2007

(Continued)

OTHER PUBLICATIONS

Translation of Official Communication from German Patent Office for German Patent Application No. 10 2008 006 961.2 dated Nov. 3, 2008.

(Continued)

*Primary Examiner* — Thao Le
*Assistant Examiner* — Matthew Gordon
(74) *Attorney, Agent, or Firm* — Williams, Morgan & Amerson, P.C.

(57) ABSTRACT

By incorporating a carbon species below the channel region of a P-channel transistor prior to the formation of the gate electrode structure, an efficient strain-inducing mechanism may provided, thereby enhancing performance of P-channel transistors. The position and size of the strain-inducing region may be determined on the basis of an implantation mask and respective implantation parameters, thereby providing a high degree of compatibility with conventional techniques, since the strain-inducing region may be incorporated at an early manufacturing stage, directly to respective "large area" contact elements.

20 Claims, 6 Drawing Sheets

U.S. PATENT DOCUMENTS

| | | | |
|---|---|---|---|
| 2005/0139930 A1 | 6/2005 | Chidambarrao et al. | 257/369 |
| 2005/0285139 A1* | 12/2005 | Forbes | 257/191 |
| 2006/0043430 A1 | 3/2006 | Feudel et al. | 257/213 |
| 2007/0018251 A1 | 1/2007 | Hirase et al. | 257/368 |
| 2007/0254461 A1 | 11/2007 | Wei et al. | 438/514 |

FOREIGN PATENT DOCUMENTS

| | | |
|---|---|---|
| DE | 102007025336 A1 | 12/2008 |

OTHER PUBLICATIONS

Translation of Official Communication from German Patent Office for German Patent Application No. 10 2007 025 336.4-33 dated Nov. 3, 2008.

Translation of Official Communication from German Patent Office for German Patent Application No. 10 2008 006 961.2 dated Jun. 6, 2011.

* cited by examiner

METHOD OF CREATING A STRAINED CHANNEL REGION IN A TRANSISTOR BY DEEP IMPLANTATION OF STRAIN-INDUCING SPECIES BELOW THE CHANNEL REGION

BACKGROUND

1. Field of the Disclosure

Generally, the subject matter disclosed herein relates to integrated circuits, and, more particularly, to transistors having strained channel regions by using an embedded strained semiconductor material within the active region to enhance charge carrier mobility in the channel region of a MOS transistor.

2. Description of the Related Art

Modern integrated circuits typically comprise a great number of circuit elements on a given chip area which are positioned and connected to each other according to a specified circuit layout. Transistors as active elements, i.e., as circuit elements enabling signal amplification and signal switching, represent one of the dominant components of an integrated circuit and, therefore, the overall performance of integrated circuits is significantly determined by the performance characteristics of the individual transistor elements. The operational behavior of the transistors, in turn, may depend on the overall dimensions, the basic transistor configuration, the manufacturing techniques used and the like. Generally, a plurality of process technologies are currently practiced, wherein, for complex circuitry, such as microprocessors, storage chips and the like, CMOS technology is currently one of the most promising approaches due to the superior characteristics in view of operating speed and/or power consumption and/or cost efficiency. During the fabrication of complex integrated circuits using CMOS technology, millions of field effect transistors, i.e., N-channel transistors and P-channel transistors, are formed on a substrate including a crystalline semiconductor layer. A MOS transistor or field effect transistor, irrespective of whether an N-channel transistor or a P-channel transistor is considered, comprises so-called PN junctions that are formed by an interface of highly doped drain and source regions with an inversely or weakly doped channel region disposed between the drain region and the source region.

The conductivity of the channel region, i.e., the drive current capability of the conductive channel, is controlled by a gate electrode formed near the channel region and separated therefrom by a thin insulating layer. The conductivity of the channel region, upon formation of a conductive channel due to the application of an appropriate control voltage to the gate electrode, depends on the dopant concentration, the mobility of the charge carriers and, for a given extension of the channel region in the transistor width direction, on the distance between the source and drain regions, which is also referred to as channel length. Hence, in combination with the capability of rapidly creating a conductive channel below the insulating layer upon application of the control voltage to the gate electrode, the conductivity of the channel region per unit length substantially determines the performance of the MOS transistors. Thus, the reduction of the channel length, and associated therewith the reduction of the channel resistivity per unit length in the transistor width direction, renders the channel length a dominant design criterion for accomplishing an increase in the operating speed of the individual transistors and thus of the entire integrated circuit.

The continuing shrinkage of the transistor dimensions, however, involves a plurality of issues associated therewith, such as reduced controllability of the channel, also referred to as short channel effects, and the like, that have to be addressed so as to not unduly offset the advantages obtained by steadily decreasing the channel length of MOS transistors. Since the continuous size reduction of the critical dimensions, i.e., the gate length of the transistors, necessitates the adaptation and possibly the new development of highly complex process techniques, for example, for compensating for short channel effects, it has been proposed to also enhance the channel conductivity of the transistor elements by increasing the charge carrier mobility in the channel region for a given channel length, thereby offering the potential for achieving a performance improvement that is comparable with the advance to a future technology node while avoiding or at least postponing many of the problems encountered with the process adaptations associated with device scaling.

One efficient mechanism for increasing the charge carrier mobility is the modification of the lattice structure in the channel region, for instance by creating tensile or compressive stress in the vicinity of the channel region to produce a corresponding strain in the channel region, which results in a modified mobility for electrons and holes, respectively. For example, for a standard crystallographic orientation of the basic silicon layer, compressive strain in the channel region may increase the mobility of holes, thereby providing the potential for enhancing the performance of P-type transistors. On the other hand, the creation of tensile strain in the channel region of an N-channel transistor may increase electron mobility. The introduction of stress or strain engineering into integrated circuit fabrication is an extremely promising approach for further device generations, since, for example, strained silicon may be considered as a "new" type of semiconductor material, which may enable the fabrication of fast, powerful semiconductor devices without requiring expensive semiconductor materials, while many of the well-established manufacturing techniques may still be used.

Therefore, in some approaches, the hole mobility of PMOS transistors is enhanced by forming a strained silicon/germanium layer in the drain and source regions of the transistors, wherein the compressively strained drain and source regions create uniaxial strain in the adjacent silicon channel region. To this end, the drain and source extension regions of the PMOS transistors are formed on the basis of ion implantation. Thereafter, respective side-wall spacers are formed at the gate electrode as required for the definition of the deep drain and source junctions and the metal silicide in a later manufacturing stage. Prior to the formation of the deep drain and source junctions, these regions are selectively recessed based on the sidewall spacers, while the NMOS transistors are masked. Subsequently, a highly in situ doped or an intrinsic silicon/germanium layer is selectively formed in the PMOS transistor by epitaxial growth techniques. Since the natural lattice spacing of silicon/germanium is greater than that of silicon, the epitaxially grown silicon/germanium layer, adopting the lattice spacing of the silicon, is grown under compressive strain, which is efficiently transferred to the channel region, thereby compressively straining the silicon therein. This integration scenario results in a significant performance gain of the P-channel transistors. Hence, a similar concept has been proposed for N-channel transistors by using a silicon/carbon material that has a smaller lattice spacing compared to silicon.

In other approaches, stressed dielectric materials may be positioned close to the transistor structures such that the internal stress of these materials may act on the transistor and finally create a respective strain in the channel regions. For this purpose, sophisticated deposition and patterning techniques may be applied to form the highly stressed materials in the contact level.

Although the above-described techniques provide enhanced performance characteristics, significant efforts may have to be made, for instance, performing selective epitaxial growth techniques for enhancing the P-channel transistor performance by an embedded silicon/germanium alloy. In other cases, in addition to complex patterning and deposition regimes for providing the highly stressed dielectric materials adjacent to the transistors, the stress transfer mechanism provided by these materials may have to "act" through the various transistor components, such as spacer elements, gate electrodes, metal silicide regions and the like, thereby reducing the overall efficiency. Furthermore, upon aggressive device scaling, the capability for the deposition and patterning of the stressed dielectric materials may be restricted by the device geometry.

The present disclosure is directed to various methods and devices that may avoid, or at least reduce, the effects of one or more of the problems identified above.

SUMMARY OF THE DISCLOSURE

The following presents a simplified summary of the disclosure in order to provide a basic understanding of some aspects disclosed herein. This summary is not an exhaustive overview, and it is not intended to identify key or critical elements of the invention or to delineate the scope of the invention. Its sole purpose is to present some concepts in a simplified form as a prelude to the more detailed description that is discussed later.

Generally, the subject matter disclosed herein relates to techniques and semiconductor devices in which a transistor having a channel region comprised of silicon may receive a strain-inducing region located proximate to, and in some illustrative aspects below, the channel region to induce a certain type of strain in the overlying channel region. In one illustrative aspect, the strain-inducing region may comprise a silicon/carbon mixture or alloy, which may cause, due to its reduced natural lattice constant compared to pure silicon, a compressive strain in the channel region, thereby providing enhanced transistor performance of a P-channel transistor, as previously explained. In other cases, additionally or alternatively, a strain-inducing region may be provided in a further transistor to induce a different type of strain compared to a carbon-containing strain-inducing material, thereby providing a high degree of flexibility in adjusting the overall transistor performance. Moreover, since the strain-inducing regions may be positioned in the form of "islands" at an appropriate depth within the active region of a transistor, while substantially not overlapping with the corresponding drain and source regions, a moderately high magnitude of strain may be created immediately adjacent to the channel region, while substantially not negatively affecting the characteristics of the corresponding PN junctions. In illustrative aspects disclosed herein, the strain-inducing regions, for instance the silicon/carbon alloy, may be formed on the basis of an implantation process, thereby substantially avoiding the problems involved in selective epitaxial growth techniques as may conventionally be used for creating strain components in the channel regions of transistors.

One illustrative method disclosed herein comprises implanting a carbon species proximate to, and in one embodiment below, a channel region of a first transistor to form a first strain-inducing area, wherein the first transistor comprises a first silicon-containing active region. The method further comprises performing an anneal process for re-crystallizing the first strain-inducing area to create a compressive strain in the channel region of the first transistor. Additionally, a gate electrode is formed above the channel region of the first transistor, and drain and source regions are formed in the first active region adjacent to the first strain-inducing area.

A further illustrative method disclosed herein comprises selectively exposing a portion of a first active region of a first transistor while covering a second active region of a second transistor. The method further comprises implanting a first implantation species into the first active region through the portion so as to form a first strain-inducing region below a channel region of the first transistor. Furthermore, an anneal process is performed to re-crystallize the first strain-inducing region in order to create a strain in the first channel region. The method additionally comprises forming a first gate electrode above the portion of the first active region and forming a second gate electrode above the second active region.

One illustrative semiconductor device disclosed herein comprises a first transistor. The first transistor comprises a carbon-containing strain-inducing region located adjacent to a silicon-containing channel region of the first transistor. Furthermore, the first transistor comprises a gate electrode formed above the channel region and drain and source regions formed adjacent to the carbon-containing strain-inducing region.

BRIEF DESCRIPTION OF THE DRAWINGS

The disclosure may be understood by reference to the following description taken in conjunction with the accompanying drawings, in which like reference numerals identify like elements, and in which.

Figure 1A:
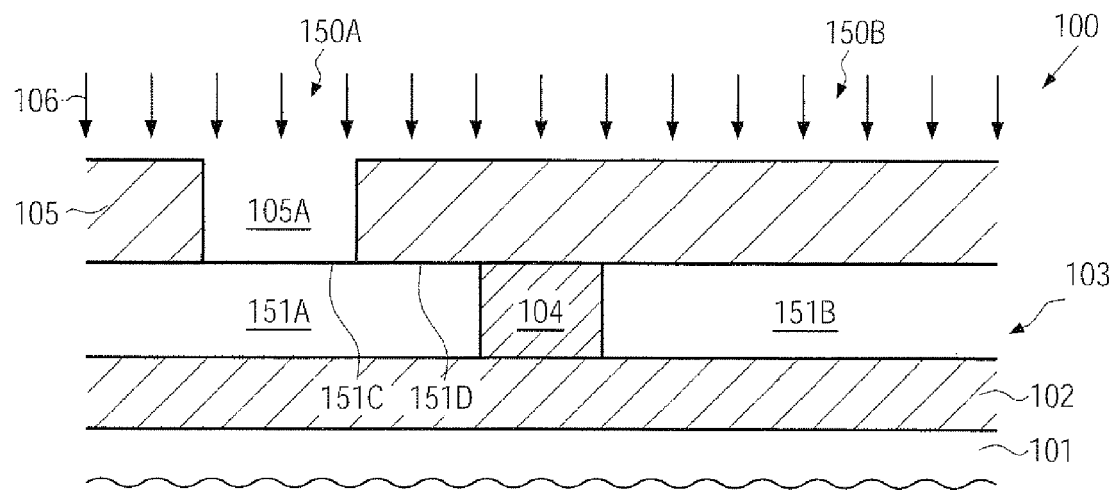
FIGS. 1a-1d schematically illustrate cross-sectional views of a semiconductor device during various manufacturing stages in forming a strain-inducing region that is located within an active region of a transistor and is substantially aligned to a channel region thereof in order to create a compressive strain in the channel region, according to illustrative embodiments.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures, systems and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

The subject matter disclosed herein relates to efficient strain-inducing mechanisms in advanced semiconductor devices, wherein a strain-inducing region may be appropriately positioned close to the channel region within an active region of a transistor device by implantation techniques prior to forming respective gate electrode structures. In one illustrative aspect disclosed herein, a silicon/carbon alloy may be positioned proximate to (while, in another embodiment, the silicon/carbon alloy may be positioned below) the channel region of a transistor to induce a compressive strain therein, wherein a depth and an extension along the depth direction of the strain-inducing region may be substantially determined by implantation parameters, such as implantation energy, while the lateral extension of the strain-inducing region may be appropriately defined on the basis of an implantation mask, which may thus cover significant portions of the drain and source areas, thereby substantially avoiding, if desired, an overlap of the drain and source regions with the strain-inducing area in an advanced manufacturing stage of the transistor. In other illustrative aspects disclosed herein, additionally or alternatively to the incorporation of a silicon/carbon material into one type of transistor, other implantation species may be incorporated below the channel regions of other transistor elements to create a desired type of strain therein. For example, appropriate species, having a greater covalent radius compared to silicon but with the same valence, may be incorporated, such as germanium, tin and the like, thereby forming a strained lattice area due to a natural lattice constant that is greater than a lattice constant of pure silicon, resulting in a tensile strain in the overlying channel region.

Consequently, the techniques and semiconductor devices disclosed herein are highly advantageous in the context of advanced semiconductor devices, since strain may be created by the strain-inducing material that is located immediately adjacent to the channel region, thereby providing high efficiency of the strain transfer compared to other mechanisms that are based on the provision of stressed dielectric materials formed above the transistor structures. On the other hand, the implantation techniques disclosed herein may provide reduced overall process complexity and enhanced process uniformity compared to other concepts in which strain-inducing semiconductor alloys may be locally formed in the drain and source regions of the transistor device, which may require complex patterning regimes in combination with sophisticated epitaxial growth techniques. Furthermore, in these conventional strategies, the electronic characteristics of the strained semiconductor alloys may also affect the transistor characteristics, since at least a significant portion of the drain and source regions may have incorporated therein the semiconductor alloy, such as a silicon/germanium material, wherein portions of the PN junctions may also be positioned within the semiconductor alloy.

It should be appreciated, however, that although the principles disclosed herein may be advantageously applied as the sole strain-inducing mechanisms in the transistor devices, these techniques may also be combined with other strain-inducing mechanisms in the transistor devices, for instance, with incorporation of a strained semiconductor material and/or stressed dielectric overlayers, since the strain-inducing mechanism disclosed herein may be provided in an early manufacturing stage, that is, prior to the formation of respective gate electrode structures, thereby not unduly affecting any subsequently applied processes, such as forming cavities or recesses in the drain and source areas and refilling them by epitaxial growth techniques. Consequently, the illustrative embodiments disclosed herein should not be considered as being restricted to transistor configurations, in which the implantation of strain-inducing "islands" in the active regions represent the only strain-inducing mechanism, unless such restrictions are explicitly set forth in the specification and/or the appended claims.

FIG. 1a schematically illustrates a cross-sectional view of a semiconductor device 100 at an early manufacturing stage. The device 100 may comprise a substrate 101, which may represent any appropriate carrier material for forming thereabove silicon-based circuit elements, such as transistors, capacitors and the like. To this end, a semiconductor layer 103 may be provided above the substrate 101, wherein the semiconductor layer 103 may comprise a significant amount of silicon, the electronic characteristics of which may be adjusted on the basis of dopant species and a respective strain, as will be explained later on in more detail. In the embodiment shown, a buried insulating layer 102 may be formed between the substrate 101 and the semiconductor layer 103, thereby defining a silicon-on-insulator (SOI) configuration. In other illustrative embodiments, as will be described later on, the semiconductor layer 103 may represent an upper portion of a substantially crystalline substrate material, or the semiconductor layer 103 may have a thickness sufficient to form circuit elements therein, which may be electrically connected to each other by a remaining portion of the layer 103. A respective configuration may be referred to herein as a bulk configuration, since silicon-based semiconductor material may be provided to form a common substrate portion of any semiconductor devices formed in and above the layer 103. In other illustrative embodiments, certain device areas may have an SOI configuration, while other device areas of the device 100 may have a bulk configuration, depending on the overall device requirements.

Furthermore, in the embodiment shown, the semiconductor layer 103 may comprise respective isolation structures 104, which may positioned so as to separate a first active region 151A of a first transistor 150A from a second active region 151B of a second transistor 150B. In this context, an active region is to be understood as a semiconductor region in the layer 103, a conductivity of which may be appropriately adjusted on the basis of dopant species that may already be incorporated in the active regions 151A, 151B or which may be incorporated in subsequent manufacturing stages when completing the transistors 150A, 150B. For example, the active regions 151A, 151B may represent a part of the semiconductor layer 103 in which respective PN junctions for the transistors 150A, 150B, as well as the corresponding channel regions, are to be formed. In some illustrative embodiments, the active regions 151A, 151B of the transistors 150A, 150B may have already incorporated therein a respective basic dopant profile in order to adjust basic transistor characteristics, such as the conductivity type thereof, the basic dopant concentration in a channel region and the like. In other illustrative embodiments, respective implantation processes may still have to be performed. Furthermore, in some illustrative embodiments, the isolation structures 104 may not have been formed in this manufacturing stage, depending on the overall process strategy. Furthermore, as shown, the device 100 may comprise an implantation mask 105, which, in one illustrative embodiment, may be provided in the form of a resist mask, possibly in combination with additional material layers, such as sacrificial pad layers, for instance in the form of silicon dioxide and the like.

The semiconductor device 100 as shown in FIG. 1a may be formed on the basis of the following processes. After providing the substrate 101 having formed thereon the silicon-based semiconductor layer 103, in some illustrative embodiments, the isolation structures 104 may be created by sophisticated lithography and etch techniques, followed by the deposition of an appropriate insulating material, such as silicon dioxide, silicon nitride and the like. Thereafter, any excess material may be removed, for instance, on the basis of chemical mechanical polishing (CMP) and/or etch techniques. Next, in some cases, an appropriate basic dopant concentration may be formed in the active regions 151A, 151B of the transistors 150A, 150B, which may be accomplished on the basis of lithography masks, wherein alternatingly the active regions 151A and 151B may be covered and exposed in order to incorporate the desired type of dopant species. In some illustrative embodiments, an anneal process may be performed to activate the dopants and cure implantation-induced damage. In other illustrative embodiments, a respective anneal process may be performed at a later stage, as will be described later on in more detail. Next, the implantation mask 105 may be provided, for instance by advanced lithography techniques, wherein an opening 105A may be defined that includes an area above which a gate electrode is to be formed in a later manufacturing state. That is, in some illustrative embodiments, the opening 105A may have lateral dimensions as may substantially correspond to the lateral dimensions of a gate electrode still to be formed, while, in other cases, the lateral dimensions of the opening 105A may be greater compared to a gate length so as to relax any alignment constraints during the lithography process for forming the mask 105. It should be appreciated, however, that at least a significant portion of the active regions 151A, 151B may be covered by the implantation mask 105, wherein portions 151D may correspond to surface areas which may correspond to drain and source regions in a later manufacturing stage. Thereafter, the device 100 is subjected to an ion implantation process 106 to introduce a desired species through an exposed portion 151C into the active region 151A at a specified target depth. In one illustrative embodiment, the implantation process 106 may be performed on the basis of a carbon species using appropriate implantation parameters, such as energy and dose, to obtain a desired carbon concentration at a specific depth in the active region 151A, wherein the lateral size of the carbon distribution is substantially determined by the opening 105A. For example, appropriate implantation parameters, such as implantation energy, may be readily established on the basis of simulation and/or experimental data, wherein the implanted dose may be determined by the ion beam current and the duration of the process 106. For example, a dose of approximately $10^{16}$-$10^{17}$ carbon atoms per $cm^2$ may result in a concentration of approximately one atomic percent carbon atoms and more at a certain depth within the active region 151A as determined by the implantation energy.

During the implantation process 106, significant lattice damage may also be created down to a specific depth determined by the implantation energy so that a respective substantially amorphized region may be created, the lateral extension of which is substantially determined by the opening 105A. In other illustrative embodiments, prior to or after the implantation process 106, a separate implantation step may be performed to substantially amorphize the exposed portion of the active region 151A down to a specified depth. For this purpose, inert atom species, such as xenon, silicon and the like, may be used on the basis of implantation parameters which may readily be established by simulation and/or experiment. For instance, by performing a respective amorphization implantation process prior to the incorporation of the desired species, such as carbon, during the process 106, enhanced implantation uniformity may be achieved by significantly reducing any channeling effects. Furthermore, the re-crystallization of a substantially amorphized semiconductor material may progress more efficiently, that is, at a lower temperature, compared to a material which may be heavily damaged but may nevertheless have a certain degree of crystalline structure. It should be appreciated that, in the embodiments shown, i.e., embodiments including the buried insulating layer 102, a certain amount of substantially crystalline material of the layer 103 may be maintained in the vicinity of the insulating layer 102, thereby providing a crystallographic template not only laterally adjacent to the damaged area but also below the heavily damaged or substantially amorphized portion of the active region 151A.

Figure 1B:
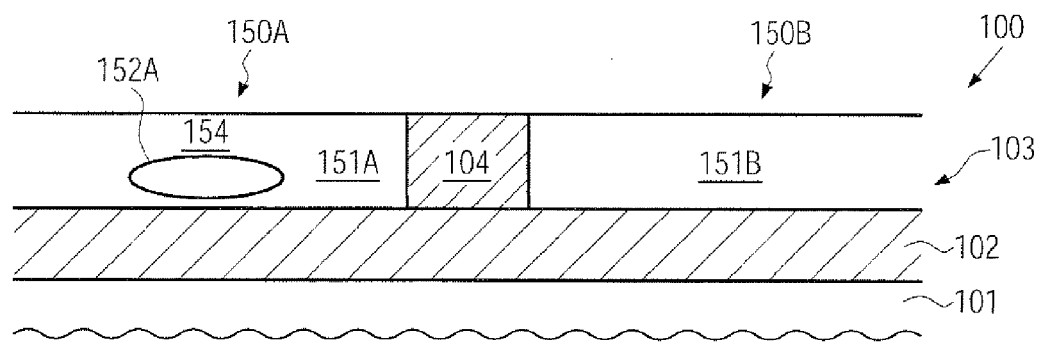

FIG. 1b schematically illustrates the semiconductor device 100 after the removal of the implantation mask 105. Hence, an implantation region 152A, which may be considered as an "island," may be positioned within the active region 151A with dimensions determined by the implantation parameters and the lateral size of the opening 105A, as previously explained. For convenience, the implantation region 152A may also be referred to as a strain-inducing region, although, in the substantially amorphous state or at least highly damaged state, the region 152A may not yet induce a strain in an overlaying area 154, which will also be referred to as a channel region. As explained above, the strain-inducing region 152A may comprise a moderately high concentration of an isoelectronic component compared to silicon so as to form a strained lattice upon re-crystallizing the region 152A. In one illustrative embodiment, a carbon species may be incorporated to the region 152A, wherein a maximum concentration of carbon atoms in the region 152A may be as high as one atomic percent and even higher, such as 1.5 to 4 percent. In other illustrative embodiments, as will be explained later on in more detail, other atomic species may be provided, such as germanium, tin and the like, which may have a greater covalent radius compared to silicon, thereby providing an increased natural lattice constant compared to pure silicon material.

Figure 1C:
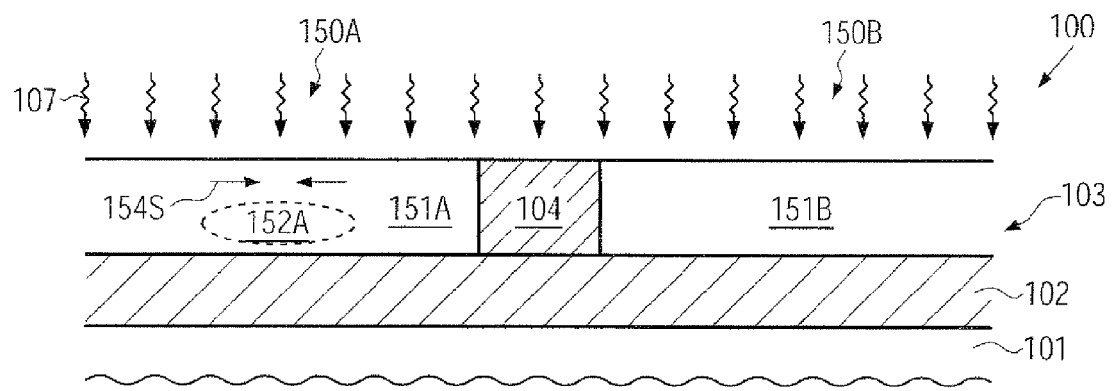

FIG. 1c schematically illustrates the semiconductor device 100, during an anneal process 107 performed on the basis of appropriately selected process parameters, such as temperature, duration, energy deposition and the like, in order to "activate" non-silicon components in the strain-inducing region 152A, for instance the carbon material and possibly other dopant species, if previously incorporated dopant species are not yet activated. In this context, the activation of a species in the region 152A may be understood as substantially re-crystallizing the material and placing a high fraction of the implanted atoms at lattice sites of the crystal structure. Consequently, during the re-crystallization process, the strain-inducing region 152A may be re-crystallized in a strained state, due to the mismatch of the lattice constants between the surrounding silicon-based template material and the material in the region 152A. In the embodiment shown, the high amount of carbon material may result in a tensile-strained crystal, which may affect the overlaying channel region 154, thereby creating a respective compressive strain 154S therein. The anneal process 107 may comprise well-established rapid thermal anneal (RTA) techniques with temperatures in the range of approximately 600-900° C. and higher, if required. In other cases, additionally or alternatively, highly advanced anneal techniques, such as laser-based or flash-based anneal process techniques, may be used, which may result in an efficient re-crystallization, while suppressing a significant dopant diffusion. For example, during a laser anneal process, one or more short radiation pulses or a short exposure to radiation with a specified irradiation wavelength are used, thereby depositing a desired amount of energy within the semiconductor layer 103. Due to the energy deposition, the irradiated areas are efficiently heated up to high temperatures, thereby imparting the required activation energy to the atoms, wherein, due to the short radiation exposure, the energy transfer and, thus, the heating of the material is sufficient to provide a low distance motion of the respective silicon and non-silicon species, while a significant diffusion over extended path lengths is substantially suppressed. Consequently, the strain-inducing region 152A, including, for instance, a moderately high carbon concentration, may be efficiently re-crystallized, while suppressing a significant dopant diffusion, for instance of N-type dopants and the like, which may have previously been incorporated into the active region 151A in order to define the conductivity type of the transistor 150A and adjust basic characteristics, such as threshold voltage and the like. In other illustrative embodiments, a laser-based or flashlight-based anneal process may be combined with a "conventional" anneal process, in which moderately low temperatures may be used, thereby also maintaining dopant diffusion at a low level, while nevertheless providing a re-growth of the crystalline structure.

Thereafter, the further processing may be continued by performing manufacturing processes for completing the transistors 150A, 150B.

Figure 1D:
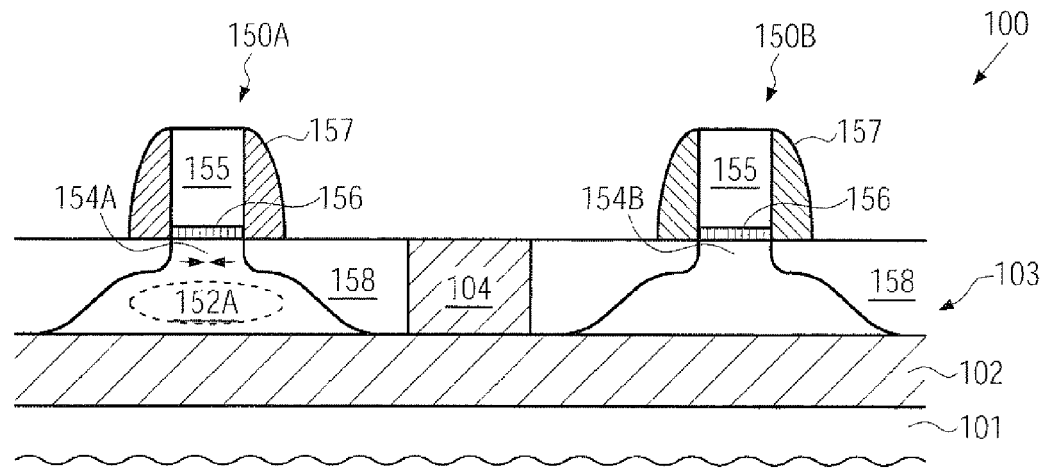

FIG. 1d schematically illustrates the semiconductor device 100 in an advanced manufacturing stage. As illustrated, the transistors 150A, 150B may comprise a gate electrode 155, optionally in combination with a sidewall spacer structure 157, wherein a gate insulation layer 156 may separate the gate electrodes 155 from the respective channel regions 154A, 154B. Furthermore, drain and source regions 158 may be formed in the corresponding active regions 151A and 151B according to the conductivity type of the transistors 150A, 150B. Additionally, the channel region 154A may be provided in a strained state due to the presence of the strain-inducing region 152A, which, in one illustrative embodiment, may be positioned within the active region 151A such that the region 152A may not substantially overlap the drain and source regions 158, i.e., with the respective PN junctions. In this respect, it should be appreciated that the region 152A may not have sharp defined borders due to the nature of the implantation process and the annealing process previously performed, wherein, in the context of this application, an outer perimeter of the region 152A may be considered as a location in which a concentration of the non-silicon species, such as the carbon material, may drop to a concentration of approximately 0.1 atomic percent and less. Consequently, in the above-defined sense, small amounts of carbon atoms may also be present in the drain and source regions 158, however, in a fraction that may not substantially affect the overall electronic characteristics of the drain and source regions 158. In other illustrative embodiments, the strain-inducing region 152A may overlap with the drain and source regions 158 and/or the channel region 154A, when an influence of the presence of a significant amount of non-silicon may be considered appropriate with respect to an influence on transistor characteristics, such as band gap energies and the like.

The semiconductor device 100 as shown in FIG. 1d may be formed on the basis of well-established process techniques. That is, the gate insulation layers 156 and the gate electrodes 155 may be formed in accordance with well-established techniques using advanced deposition and/or oxidation techniques for forming the gate dielectric, followed by the deposition of an appropriate gate electrode material, such as polysilicon. Thereafter, sophisticated lithography and etch processes may be performed in order to pattern the gate electrode material and the gate dielectric. Next, implantation processes may be performed to define at least a portion of the drain and source regions 158 and the sidewall spacer structure 157 may be provided by using well-established deposition and etch recipes. Depending on the complexity of the dopant profile required for the drain and source regions 158, two or more individual spacer elements may be formed while intermediately performing implantation processes. Next, an anneal process may be performed to activate the dopant species and re-crystallize implantation-induced damage.

As previously explained, further strain-inducing mechanisms may be provided in one or both of the transistors 150A, 150B. For example, a strained silicon/germanium material may be incorporated into the drain and source regions 158 of the transistor 150A, if an enhanced compressive strain in the channel region 154A may be desired. For this purpose, after formation of the gate electrodes 155, appropriately sized cavities or recesses may be etched into the active region 151A and may be refilled with a silicon/germanium material. Thereafter, the further processing may be continued as previously described. Similarly, a silicon/carbon material may be formed by epitaxial growth techniques in the transistor 150B, if a tensile strain in the channel region 154B is required. In still other illustrative embodiments, after forming metal silicide regions, if required, in the gate electrodes 155 and the drain and source regions 158, a highly stressed dielectric material may be positioned above the transistors 150A, 150B having an appropriate internal stress to induce strain in the channel regions 154A and/or 154B. Consequently, the techniques disclosed herein for forming the transistor device 100 may provide enhanced strain characteristic for the transistor 150A and may further be highly compatible with conventional strain-inducing mechanisms.

With reference to FIGS. 2a-2g, further illustrative embodiments will now be described in which a hard mask may be used for defining an exposed portion of respective active regions and also for forming gate electrodes after the incorporation of a desired implantation species, thereby avoiding sophisticated lithography processes for aligning and patterning an opening corresponding to a gate area of advanced transistor elements.

Figure 2A:
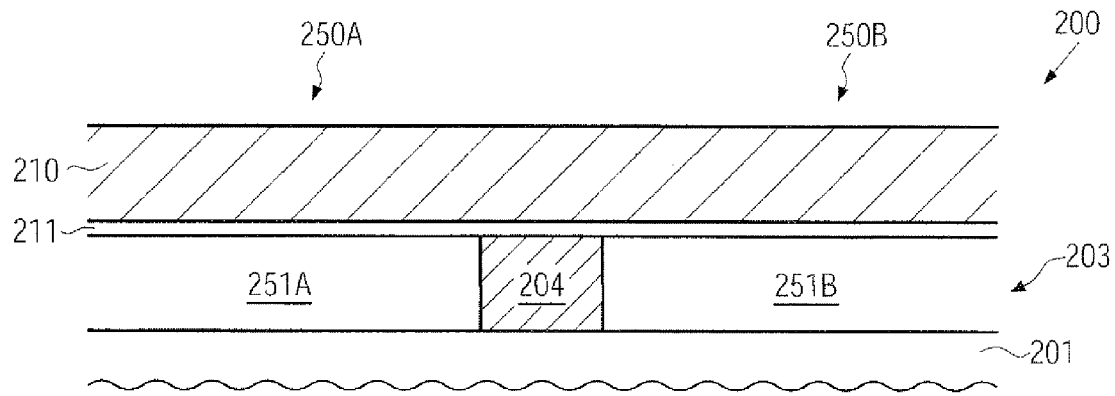
FIGS. 2a-2g schematically illustrate cross-sectional views of a semiconductor device in which a strain-inducing "island" may be positioned within an active region of a transistor element by ion implantation performed on the basis of a hard mask, which may also be used as a template during the formation of a gate electrode, according to further illustrative embodiments.

FIG. 2a schematically illustrates a semiconductor device 200 in an early manufacturing stage, which may comprise a substrate 201, above which may be formed a silicon-based semiconductor layer 203. Moreover, an isolation structure 204 may define a first active region 251A and a second active region 251B for a first transistor 250A and a second transistor 250B, respectively. With respect to the components described so far, the same criteria apply as previously explained with reference to the semiconductor device 100. Furthermore, the device 200 may comprise a hard mask layer 210, possibly in combination with an etch stop liner 211. For example, the hard mask layer 210 may be comprised of silicon nitride, silicon oxynitride, silicon carbide and the like. The optional etch stop liner 211 may be provided in the form of a material having moderately high etch selectivity with respect to the material of the hard mask layer 210. The optional etch stop liner 211 and the hard mask layer 210 may be formed in accordance with well-established deposition techniques, wherein a thickness of the layer 210 is selected such that ion stopping capabilities may be achieved as required for acting as an implantation mask in a later manufacturing stage. Thereafter, an advanced lithography process may be carried out to provide an appropriate mask for patterning the hard mask layer 210 to receive openings, which may substantially correspond to the lateral dimensions of gate electrode structures still to be formed. Thereafter, the hard mask layer 210 may be patterned on the basis of well-established process techniques by performing an anisotropic selective etch process, wherein the optional liner 211 may act as an etch stop material, while, in other cases, the semiconductor layer 203 may exhibit a sufficient etch selectivity.

Figure 2B:
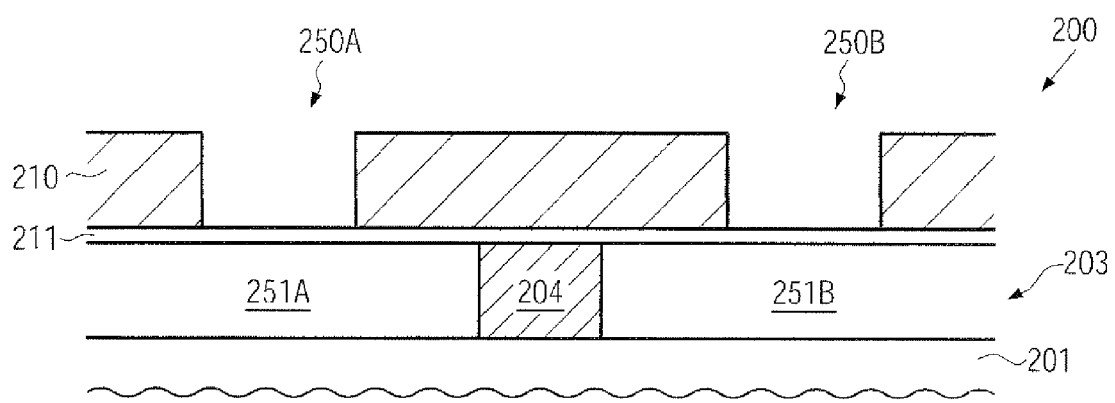

FIG. 2b schematically illustrates the device 200 after the above-described process sequence. Hence, the hard mask layer 210 may comprise openings 210A, 210B, which may substantially correspond to the lateral dimensions of gate electrodes still to be formed. In other illustrative embodiments (not shown), the lateral size of the openings 210A, 210B may be adjusted on the basis of a deposition process after an etch process, which may have been performed on the basis of a lithography mask. For this purpose, after forming respective "coarse" openings in the hard mask layer 210, the fine tuning may be obtained by selecting an appropriate thickness during a subsequent deposition process and removing material of the deposited layer on the basis of an anisotropic etch process, thereby obtaining respective side-wall spacers in the openings 210A, 210B, thereby defining a desired lateral size of the openings 210A, 210B. In other illustrative embodiments, the formation of optional sidewall spacers in the openings 210A, 210B may be performed in a later stage, as will be described with reference to FIG. 2d.

Figure 2C:
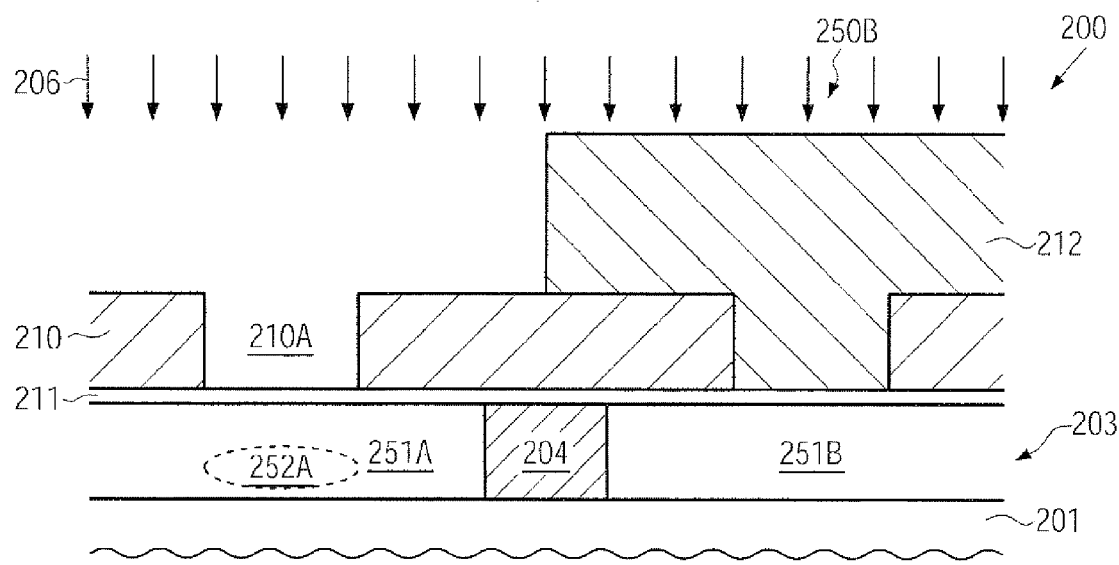

FIG. 2c schematically illustrates the semiconductor device 200 in a further advanced manufacturing stage, in which an implantation mask 212 may be provided so as to cover the transistor 250B, while exposing the opening 210A. It should be appreciated that the mask 212 may be formed on the basis of well-established concepts, which may also be used for creating respective vertical dopant profiles in the active regions 251A, 251B. Hence, significantly less critical constraints with respect to alignment are imposed on the lithography process for forming the mask 212, since the openings 210A, 210B, which may act as implantation masks for incorporating one or more species for strain-inducing regions, may also act as a template for the formation of gate electrode structures in a later manufacturing stage. Furthermore, the device 200 may be subjected to an implantation process 206 designed to create an implantation region 252A, also referred to as a strain-inducing region, the lateral size of which may be defined by the lateral size of the opening 210A. With respect to any characteristics of the region 252A, the same criteria apply as previously explained with reference to the region 152A.

Figure 2D:
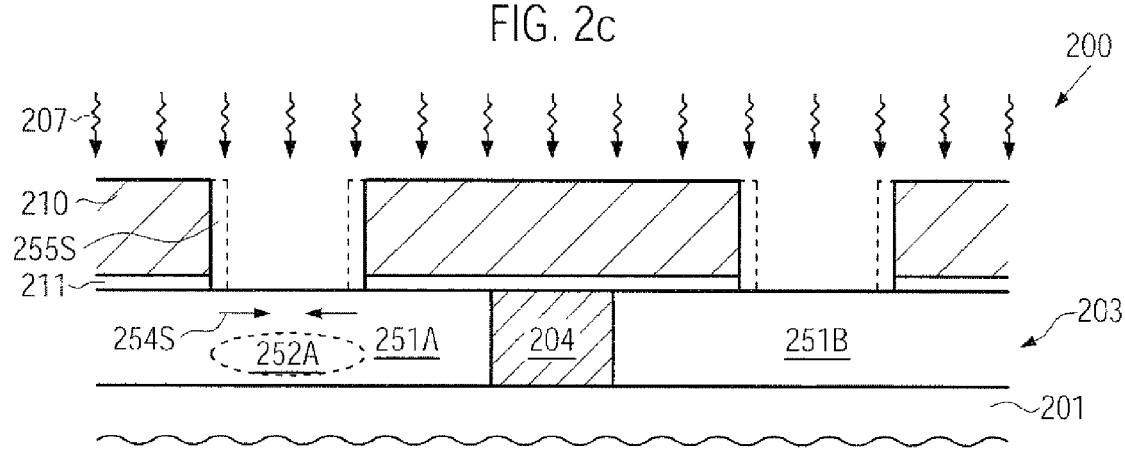

FIG. 2d schematically illustrates the device 200 when subjected to an anneal process 207 that is designed to re-crystallize the strain-inducing region 252A, as previously explained. Consequently, a respective strain 254S may be generated in the silicon material above the region 252A, as previously explained. Furthermore, during the anneal process 207, a remaining portion of the mask layer 210 may provide enhanced process conditions, since the mask layer 210 may act as a rigid material which may reduce or suppress a deformation of the crystalline template material adjacent to the re-crystallizing region 252A.

Moreover, as illustrated, if required, optional sidewall spacers 255S may be formed in the openings 210A, 210B in order to finely tune the desired gate length, which may be formed within the resulting opening. For this purpose, for instance, an appropriate material, such as silicon dioxide, may be deposited in a conformal manner and may be subsequently anisotropically etched, thereby creating the spacer 255S. Thus, by adjusting the initial layer thickness and selecting appropriate etch parameters, the lateral dimension of the initial openings 210A, 210B may be reduced in accordance with device requirements. The sidewall spacers 255S, if required, may be formed prior to or after the anneal process 207 as deemed appropriate in view of process efficiency.

Figure 2E:
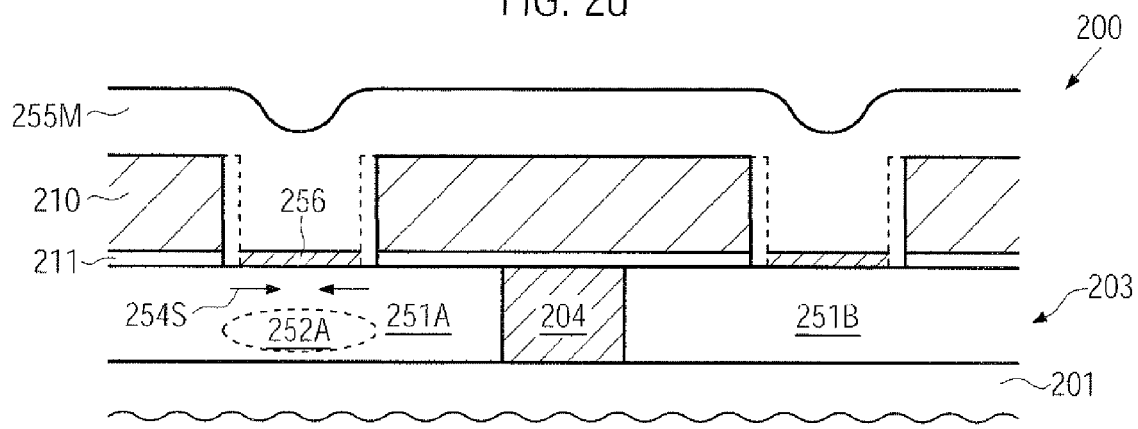

FIG. 2e schematically illustrates the semiconductor device 200 with a layer of gate electrode material 255M formed above the transistors 250A, 250B, thereby filling the openings 210A, 210B. Furthermore, a gate insulation layer 256 may be formed in the openings 210A, 210B, wherein the gate insulation layer 256 may have a thickness and material composition as required for the transistors 250A, 250B.

The device 200 may be formed by well-established low-pressure chemical vapor deposition (CVD) techniques, when, for instance, polysilicon material is to be deposited as the gate electrode material. The gate insulation layer 256 may be formed, for instance, by advanced oxidation and/or deposition techniques. Thereafter, any excess material of the layer 255M may be removed on the basis of a chemical mechanical polishing (CMP) and/or etch process, thereby providing a substantially planar surface topography. For instance, during a CMP process, the hard mask layer 210 may also act as an efficient CMP stop layer.

Figure 2F:
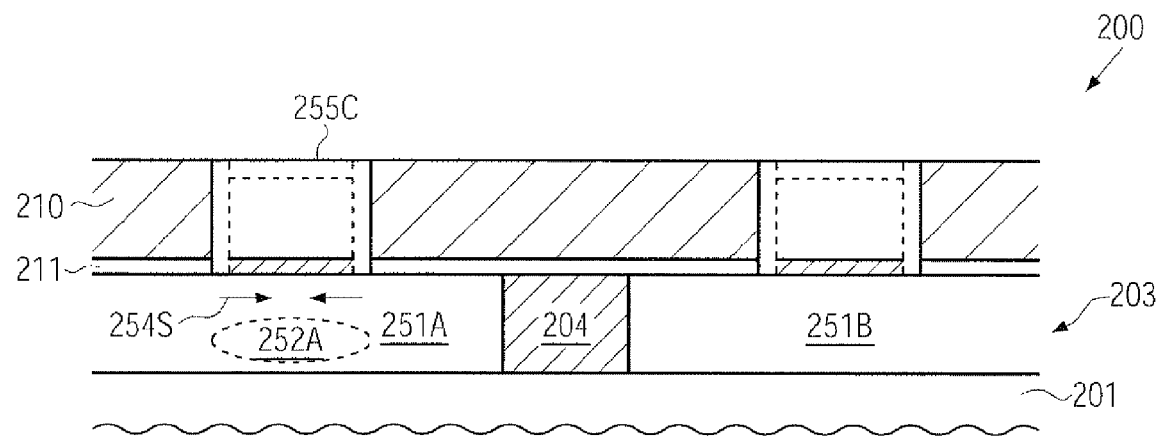

FIG. 2f schematically illustrates the device 200 after the above-described process sequence. Furthermore, if desired, a cap layer 255C may be formed on top of the gate electrodes 255, if the exposure of the gate electrode 255 to an etch ambient for selectively removing the hard mask material 210 may be deemed inappropriate. To this end, the cap layer 255C may be formed by oxidation when a polysilicon material is used. Next, the hard mask material 210 may be removed on the basis of a wet chemical or plasma-assisted selective etch process, for which a plurality of well-established recipes are available. For instance, silicon nitride may be selectively removed with respect to silicon dioxide material.

Figure 2G:
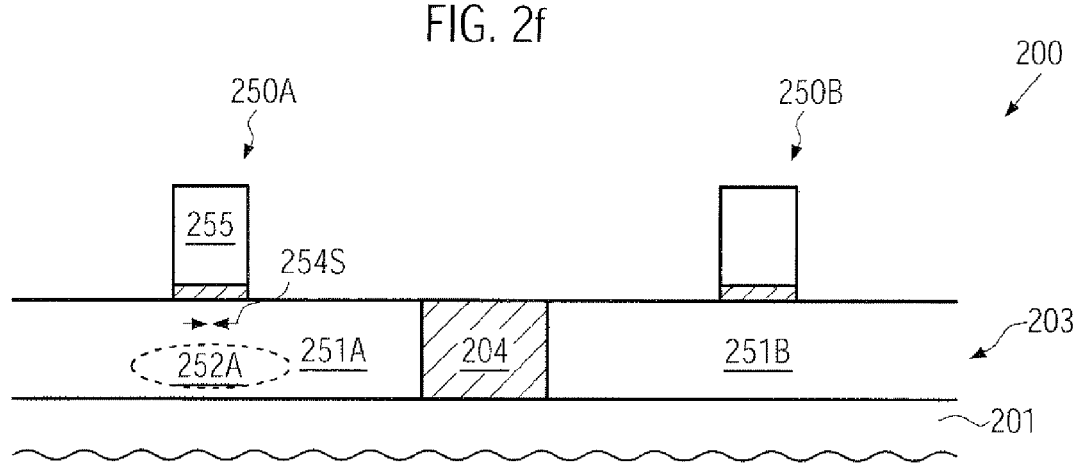

FIG. 2g schematically illustrates the device 200 after the removal of the hard mask layer 210, the optional etch stop liner 211, the optional cap layer 255C and spacers 255S. Hence, the transistors 250A, 250B may comprise the gate electrodes 255 having a desired length defined by the lateral size of the openings 210A, 210B and possibly a width of the spacers 255S (FIG. 2d). Furthermore, the desired strain 254S may be created by the strain-inducing region 252A. Thereafter, the further processing may be continued, as previously described with reference to the device 100. Consequently, the hard mask layer 210 may be used for defining the position of the region 252A and also for forming the gate electrode 255, thereby ensuring a self-aligned behavior, on the basis of a less critical lithography step for selectively covering the opening 210B, which may be accomplished on the basis of well-established techniques.

With reference to FIGS. 3a-3e, further illustrative embodiments will now be described in which different implantation species may be incorporated below the channel regions of respective transistor elements, thereby enabling the creation of different types of strain on the basis of implantation techniques.

Figure 3A:
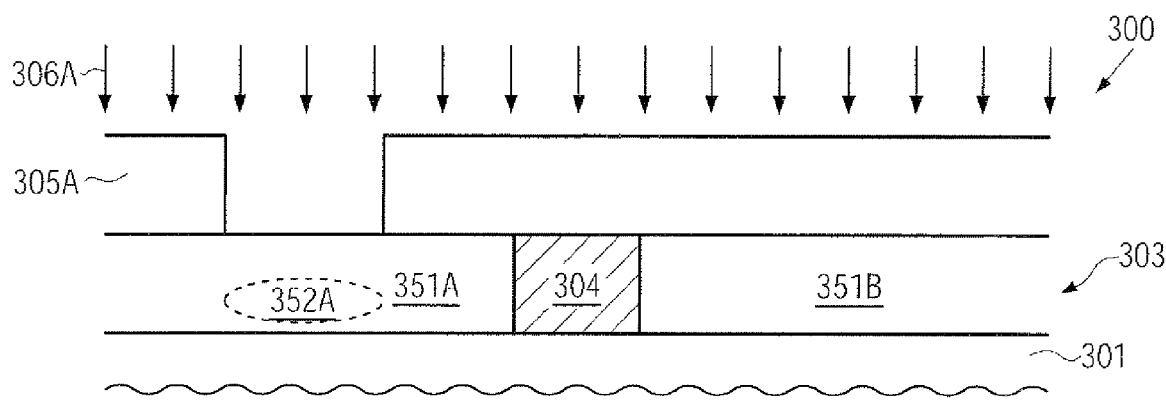
FIGS. 3a-3e schematically illustrate cross-sectional views of a semiconductor device including different types of transistors that may receive strain-inducing regions on the basis of ion implantation by using an appropriate masking regime, according to still other illustrative embodiments.

FIG. 3a schematically illustrates a semiconductor device 300 comprising a substrate 301 and a semiconductor layer 303. Furthermore, an isolation structure 304 may define a first active region 351A and a second active region 351B. With respect to these components, the same criteria apply as previously explained with reference to the devices 100 and 200. Furthermore, an implantation mask 305A may be formed above the layer 303, for instance in the form of a resist mask, so as to expose a portion of the active region 351A, while covering the active region 351B. Moreover, an implantation process 306A may be performed to create an implantation region, also referred to as a strain-inducing region 352A, having characteristics as previously explained. For example, the region 352A may have incorporated therein a moderately high fraction of carbon atoms, as previously explained.

Figure 3B:
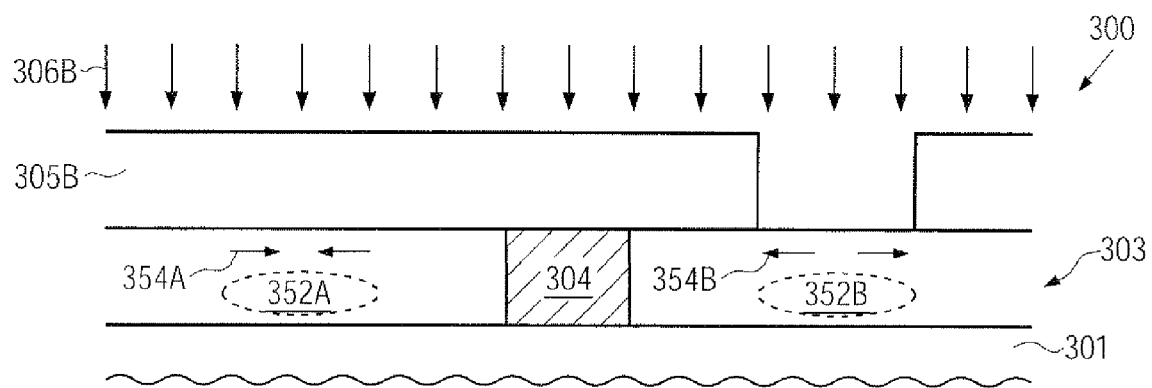

FIG. 3b schematically illustrates the device 300 after the removal of the mask 305A and the formation of a further implantation mask 305B designed to create a respective implantation region or strain-inducing region 352B in the second active region 351B during a further implantation process 306B. During the process 306B, any appropriate implantation species may be incorporated in order to obtain a desired type of strain in the second channel region 351B. In one illustrative embodiment, an isoelectronic species with respect to silicon may be incorporated that may have a greater covalent radius compared to silicon. For instance, germanium and/or tin may be introduced by appropriately selected implantation parameters in order to define the region 352B. For example, tin may be processed in conventional implantation tools by providing an appropriate precursor gas, which may then be ionized and used as an ion source for the implantation process. Since tin has a significantly greater covalent radius compared to germanium, even a reduced concentration of one to several atomic percent may be sufficient to obtain a moderately high strain component in the region 351B. After the implantation process 306B, the further processing may be continued by performing an anneal process for activating, that is, re-crystallizing, the regions 352A, 352B, thereby creating strain components 354A, 354B of different type, as previously explained.

Figure 3C:
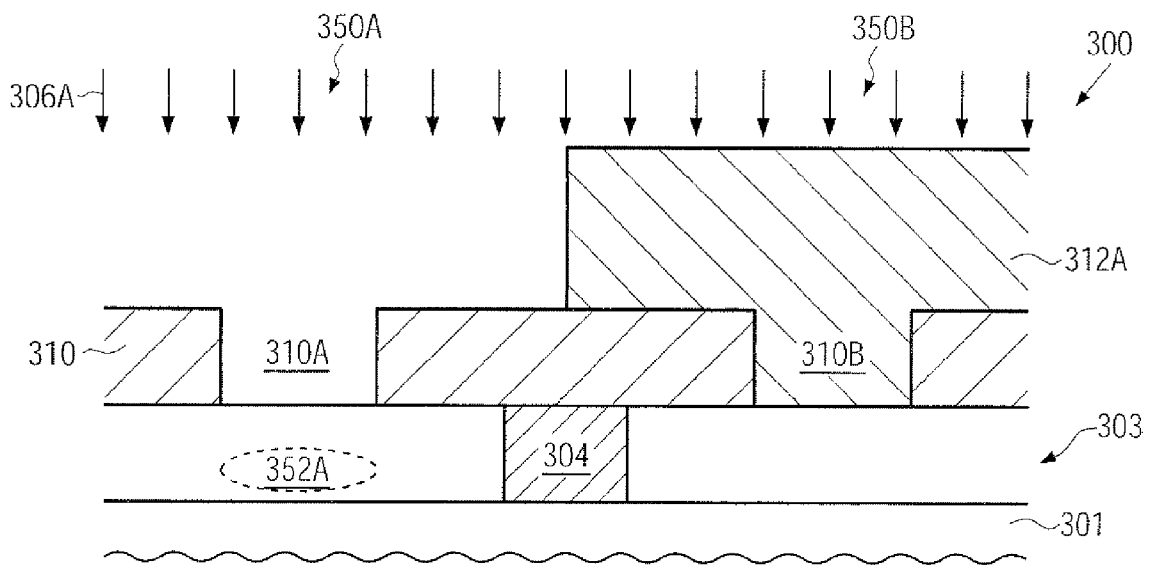

FIG. 3c schematically illustrates the device 300 according to still further illustrative embodiments, in which a hard mask 310 may be provided to define respective openings 310A, 310B, as also previously discussed with reference to the hard mask 210 of the device 200. Furthermore, during the implantation process 306A, an implantation mask 312A may be provided to cover the opening 310B.

Figure 3D:
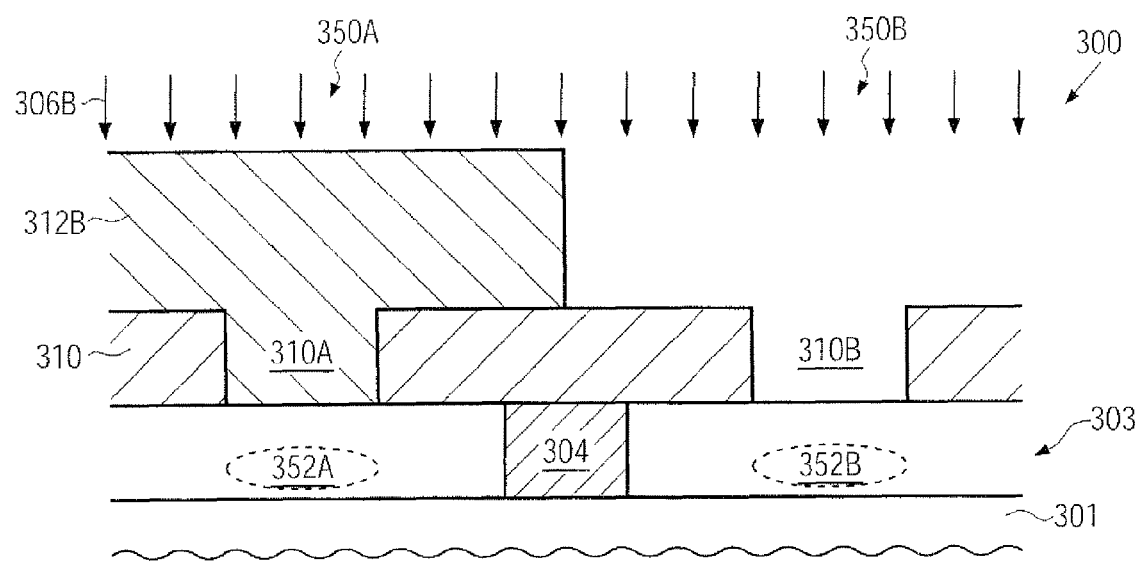

FIG. 3d schematically illustrates the device 300 with a further implantation mask 312B, which covers the opening 310A during the implantation process 306B.

Figure 3E:
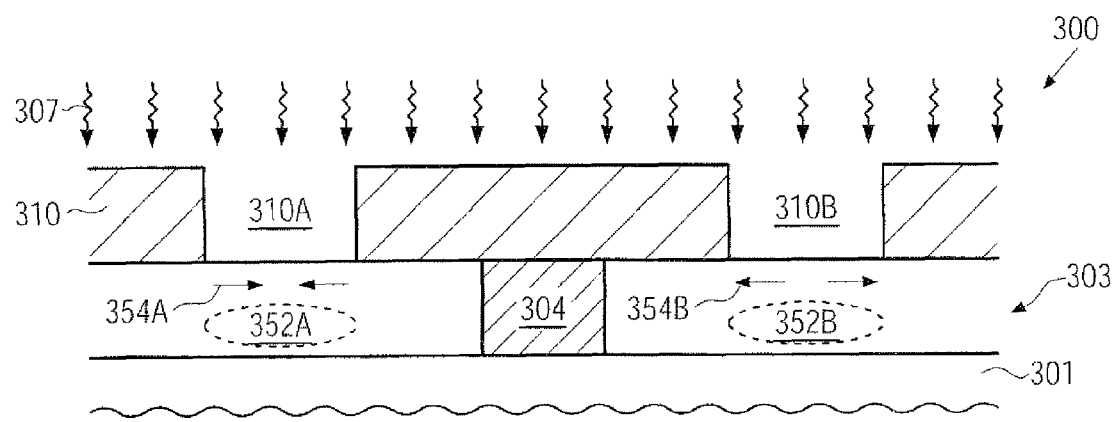

FIG. 3e schematically illustrates the semiconductor device 300 during an anneal process 307 so as to re-crystallize the regions 352A, 352B. Thus, as previously explained, strains 354A, 354B of different type may be induced above the respective strain-inducing regions 352A, 352B. In the embodiment shown, the region 352A may comprise carbon, thereby inducing a compressive strain 354A, which may be advantageous when the transistor 350A may represent a P-channel transistor. On the other hand, the region 352B may comprise germanium and/or tin, thereby causing a tensile strain 354B, which may enhance the performance of the transistor 350B when representing an N-channel transistor.

As a result, the principles disclosed herein relate to techniques and respective semiconductor devices in which a strain-inducing region may be formed within an active region on the basis of ion implantation, thereby providing a high degree of flexibility in positioning and dimensioning the respective strain-inducing region. In some illustrative embodiments, by incorporating a carbon material into a silicon-containing region, a compressive strain may be generated in a channel region of a P-channel transistor, thereby providing an efficient strain-inducing mechanism, which may be compatible with other strain-inducing mechanisms established during a later phase of the manufacturing process. In other illustrative embodiments, an implantation mask may be provided as a hard mask, which may also act as a template during the formation of gate electrode structures, thereby providing a self-aligned process for positioning a strain-inducing region below a channel region of a transistor element.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
    implanting a first implantation species proximate a channel region of a first transistor using an implantation mask comprising a resist mask to form a first strain-inducing area, said first transistor comprising a first silicon-containing active region, wherein forming said implantation mask comprises forming a hard mask and forming said resist mask above said hard mask;
    performing an anneal process for re-crystallizing said first strain-inducing area so as to create a compressive strain in said channel region of said first transistor;
    forming a gate electrode above said channel region of said first transistor; and
    forming drain and source regions in said first active region adjacent to said first strain-inducing area.

2. The method of claim 1, wherein implanting said first implantation species comprises forming said implantation mask above said first active region, said implantation mask exposing an area corresponding to said gate electrode while covering at least a portion of an area corresponding to said drain and source regions.

3. The method of claim 1, wherein said gate electrode is formed by using said hard mask as a template.

4. The method of claim 3, wherein forming said gate electrode comprises forming a gate insulation layer on said area corresponding to said gate electrode, depositing a gate electrode material and removing said hard mask selectively to said gate electrode material.

5. The method of claim 1, further comprising implanting a second implantation species below a channel region of a second transistor to form a second strain-inducing area, said second transistor having a second silicon-containing active region.

6. The method of claim 5, wherein said second strain-inducing region induces a tensile strain in said second channel region after performing said anneal process.

7. The method of claim 5, wherein said second implantation species comprises at least one of germanium and tin.

8. The method of claim 5, wherein implanting said first implantation species and said second implantation species comprises forming a first implantation mask exposing an area corresponding to said gate electrode of said first transistor and forming a second implantation mask exposing an area corresponding to a gate electrode of said second transistor.

9. The method of claim 8, further comprising forming said hard mask prior to forming said first and second implantation masks, wherein said hard mask exposes said areas corresponding to the gate electrodes of said first and second transistors.

10. The method of claim 1, further comprising performing an implantation process so as to substantially amorphize said first strain-inducing area prior to performing said anneal process.

11. The method of claim 1, wherein said first transistor is a P-channel transistor.

12. A method, comprising:
selectively exposing a portion of a first active region of a first transistor while covering a second active region of a second transistor using an implantation mask;
implanting a first implantation species into said first active region through said portion to form a first strain-inducing region below a channel region of said first transistor;
performing an anneal process in presence of at least a portion of said implantation mask so as to re-crystallize said first strain-inducing region to create a strain in said first channel region; and
forming a first gate electrode above said portion of said first active region and forming a second gate electrode above said second active region.

13. The method of claim 12, further comprising performing a further implantation process so as to substantially amorphize said first strain-inducing region prior to performing said anneal process.

14. The method of claim 12, further comprising selectively exposing a portion of a second active region of said second transistor while covering said first active region of said first transistor; and implanting a second implantation species into said second active region through said exposed portion so as to form a second strain-inducing region below a channel region of said second transistor.

15. The method of claim 14, wherein said second strain-inducing region creates a type of strain in the channel region of said second transistor that is other than the type of strain created by said first strain-inducing region.

16. The method of claim 15, wherein said first implantation species comprises carbon and said second implantation species comprises at least one of germanium and tin.

17. The method of claim 14, further comprising forming a hard mask configured to expose said portions of the first and second active regions.

18. The method of claim 17, wherein said first and second gate electrodes are formed by using said hard mask as a template.

19. The method of claim 1, wherein said first implantation species comprises carbon.

20. The method of claim 1, wherein said first implantation species comprises tin.

* * * * *